US012387864B2

(12) United States Patent
Jameson

(10) Patent No.: US 12,387,864 B2
(45) Date of Patent: Aug. 12, 2025

(54) TRANSFORMER-BASED MATCHING NETWORK FOR ENHANCED IC DESIGN FLEXIBILITY

(71) Applicant: RAFAEL ADVANCED DEFENSE SYSTEMS LTD., Haifa (IL)

(72) Inventor: Samuel Jameson, Binyamina (IL)

(73) Assignee: Rafael Advanced Defense Systems Ltd., Haifa (IL)

( * ) Notice: Subject to any disclaimer, the term of this patent is extended or adjusted under 35 U.S.C. 154(b) by 979 days.

(21) Appl. No.: 17/421,424

(22) PCT Filed: Feb. 4, 2020

(86) PCT No.: PCT/IL2020/050132
§ 371 (c)(1),
(2) Date: Jul. 8, 2021

(87) PCT Pub. No.: WO2020/161705
PCT Pub. Date: Aug. 13, 2020

(65) Prior Publication Data
US 2022/0122757 A1 Apr. 21, 2022

(30) Foreign Application Priority Data
Feb. 5, 2019 (IL) .......................... 264679

(51) Int. Cl.
*H01F 19/04* (2006.01)
*H01F 27/28* (2006.01)
(Continued)

(52) U.S. Cl.
CPC ......... *H01F 19/04* (2013.01); *H01F 27/2804* (2013.01); *H03H 7/0115* (2013.01);
(Continued)

(58) Field of Classification Search
CPC ... H01F 19/04; H01F 27/2804; H03H 7/0115; H03H 7/38
See application file for complete search history.

(56) References Cited

U.S. PATENT DOCUMENTS

| 7,312,683 | B1 | 12/2007 | Lee |
| 9,653,204 | B2 | 5/2017 | Vanukuru |

(Continued)

FOREIGN PATENT DOCUMENTS

| CN | 104103636 A | 10/2014 |
| EP | 2549646 A1 | 1/2013 |

OTHER PUBLICATIONS

Li, C.-H. et al., "A 1.2-V 5.2-mW 20-30-GHz Wideband Receiver Front-End in 0.18-μm CMOS," IEEE Trans. Microw. Theory Techn., vol. 60, No. 11, pp. 3502-3511, Nov. 2012.
(Continued)

*Primary Examiner* — David Bilodeau
(74) *Attorney, Agent, or Firm* — Fenwick & West LLP; Daniel Brownstone

(57) ABSTRACT

An Integrated Circuit (IC) containing at least one printed transformer-based matching network, which comprises: a) at least one printed transformer-based matching network with reduced size, which comprises a printed transformer with multiple internal ports in the form of electromagnetic discontinuities, introduced along the transverse dimension of the printed transformer; reactive elements, added to of the internal ports to thereby increase the order of the transformer-based matching network, the one or more reactive elements are printed along the transverse dimension of the matching network; a printed component connected to the input port of the matching network; a printed component connected to the output port of the matching network.

20 Claims, 7 Drawing Sheets

(51) Int. Cl.
   *H03H 7/01* (2006.01)
   *H03H 7/38* (2006.01)
   *H03H 1/00* (2006.01)

(52) U.S. Cl.
   CPC ....... *H03H 7/38* (2013.01); *H03H 2001/0064* (2013.01); *H03H 2001/0078* (2013.01)

(56) References Cited

U.S. PATENT DOCUMENTS

| | | |
|---|---|---|
| 2004/0140528 A1 | 7/2004 | Kim et al. |
| 2010/0019857 A1* | 1/2010 | McMorrow ............... H03F 1/56 333/32 |
| 2012/0154071 A1* | 6/2012 | Bradley ................... H03H 7/38 333/32 |
| 2013/0207872 A1* | 8/2013 | Bakalski ................. H03H 7/40 333/32 |
| 2014/0314132 A1 | 10/2014 | Leuschner et al. |
| 2014/0315501 A1 | 10/2014 | Rudell et al. |
| 2015/0318107 A1 | 11/2015 | Hecht |
| 2016/0028484 A1* | 1/2016 | Aguirre .................. H03H 7/463 336/107 |
| 2016/0164486 A1* | 6/2016 | Andersson ............... H03H 7/09 333/25 |
| 2016/0240924 A1* | 8/2016 | Ishizuka ................ H01Q 5/335 |
| 2017/0070199 A1* | 3/2017 | Anderson ............. H03F 1/0261 |
| 2017/0133999 A1* | 5/2017 | Ishizuka ................. H01Q 1/48 |
| 2017/0310296 A1* | 10/2017 | Hahn ..................... H01G 4/232 |
| 2019/0123554 A1* | 4/2019 | Nakaiso ............. H01F 17/0013 |
| 2019/0357348 A1* | 11/2019 | Yuasa ...................... H03H 7/46 |
| 2020/0212864 A1* | 7/2020 | Flemming ................ H03H 3/00 |

OTHER PUBLICATIONS

Bassi, M. et al., "A 40-67 GHz Power Amplifier with 13 dBm $P_{SAT}$ and 16% PAE in 28 nm CMOS LP," IEEE J. Solid-State Circuits, vol. 50, No. 7, pp. 1618-1628, Jul. 2015.

Zhao, J. et al., "A 15 GHZ-Bandwidth 20 dBm $P_{SAT}$ Power Amplifier with 22% PAE in 65 nm CMOS ," in Proc. IEEE Custom Integr. Circuits Conf. (CICC), Sep. 2015, pp. 1-4.

Bhagavatula, V. et al., "An Ultrawideband IF Millimeter-Wave Receiver with a 20 GHz Channel Bandwidth Using Gain-Equalized Transformers," IEEE J. Solid-State Circuits, vol. 51, No. 2, pp. 323-331, Feb. 2016.

Vigilante, M. et al., "On the Design of Wideband Transformer-Based Fourth Order Matching Networks for E-Band Receivers in 28-nm CMOS", IEEE J. Solid-State Circuits, vol. 52, No. 8, pp. 2071-2082, Aug. 2017.

PCT International Search Report and Written Opinion, PCT Application No. PCT/IL2020/050132, May 7, 2020, 6 pages.

Batistell, G. et al., "System-in-Package Network for RF Wireless Transceivers," 2016 Austrochip Workshop on Microelectronics, Date of Conference: Oct. 19, 2016, pp. 35-39.

Extended European Search Report, European Patent Application No. 20753020.5, Oct. 5, 2022, 14 pages.

* cited by examiner

*Electromagnetic discontinuity in the Y-axis*

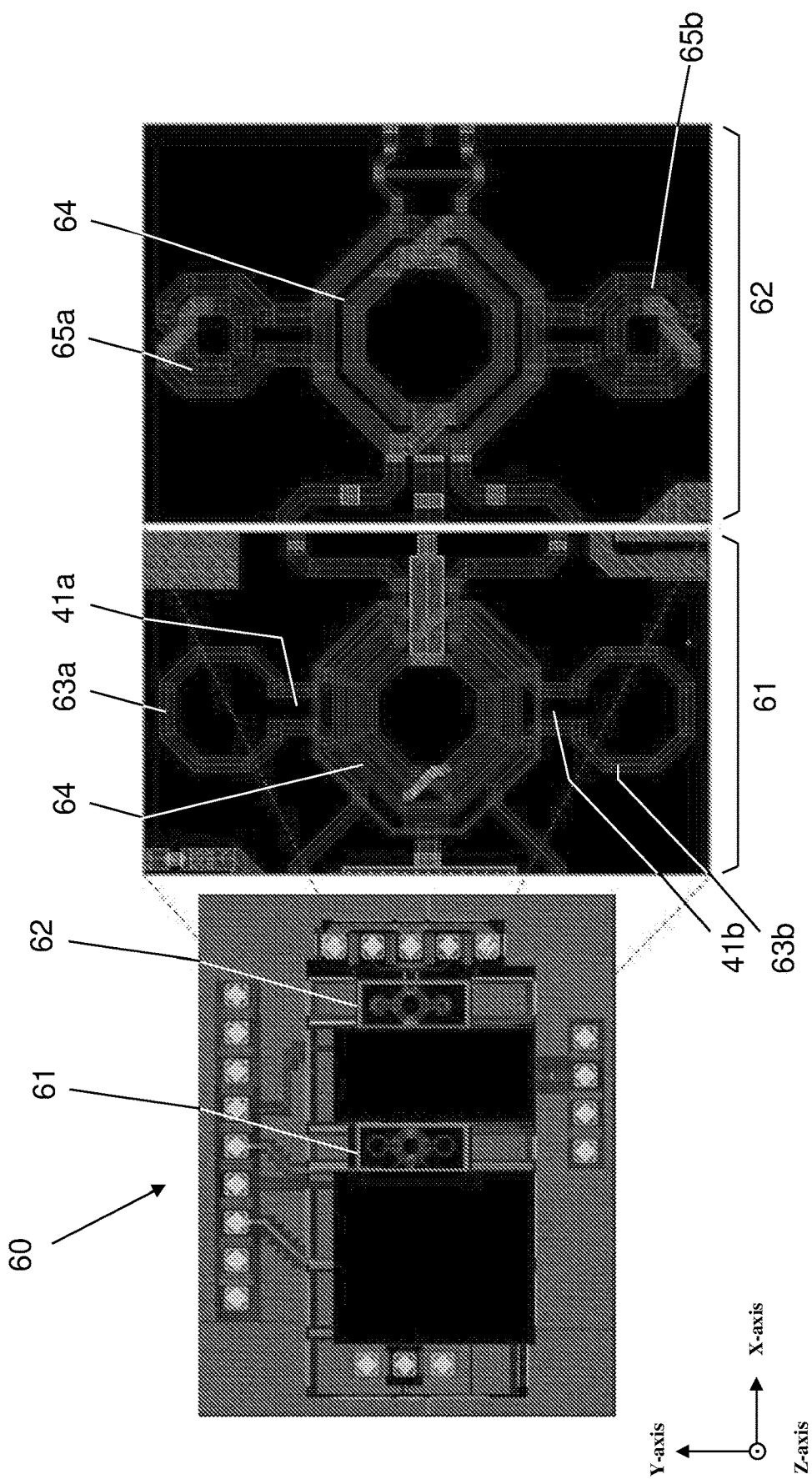

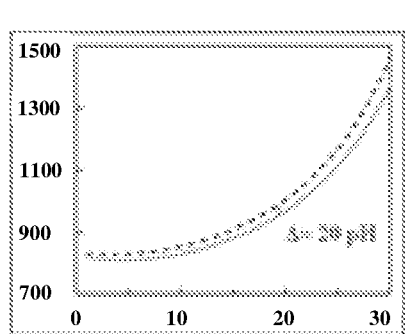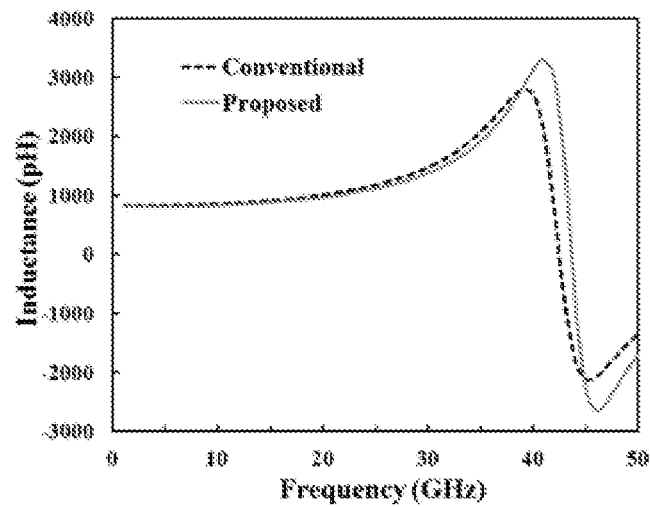
Fig. 8a
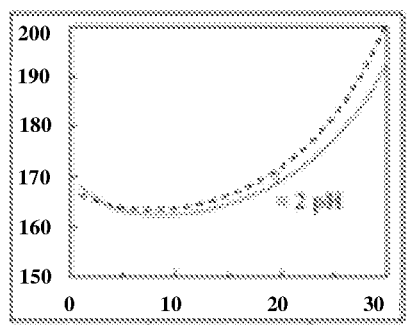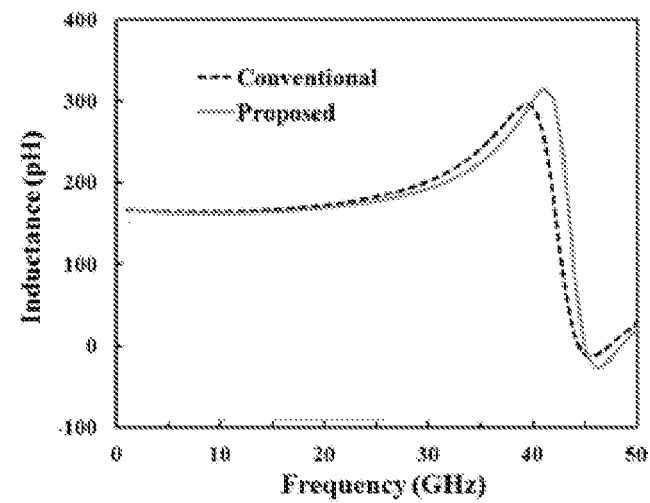
Fig. 8b

TRANSFORMER-BASED MATCHING NETWORK FOR ENHANCED IC DESIGN FLEXIBILITY

FIELD OF THE INVENTION

The present invention relates to the field of RF Integrated Circuits. More particularly, the invention relates to compact Integrated Circuit (IC) implementation of transformer-based matching networks with enhanced IC design flexibility.

BACKGROUND OF THE INVENTION

Advanced MOSFET technologies such as Complementary Metal-Oxide-Semiconductor (CMOS), Silicon-Germanium (SiGe), Indium Phosphide (InP), Gallium Arsenide (GaAs), Gallium Nitride (GaN) enables the design and realization of RF, microwave and mm-wave components with improved complexity, performances and frequencies, for civil and military uses. However, due to the vast scaling of CMOS within the last 20 years, CMOS has become the most used process in all industries due to its low-cost and mass-manufacturing capabilities.

While most systems in Group III-Group V technologies (mainly GaAs and GaN) use single-ended design as standard, CMOS based technologies widely use differential design as a standard for its inherent performances improvements (power, isolation, etc.).

RF Integrated Circuits (RFICs) component performances are critical in all RF, microwave and mm-wave systems. They are the first limiting factor of the system operation range, frequency bandwidth and calibration simplicity. RFIC components can be modeled into 2 basic cells: passive and active components. In order to realize a system, each component is cascaded one after the other to typically create transmit, or receive channels (a transmitter or a receiver) or even combined, to create a radio transceiver.

Matching network connecting components and sub-components of a system are mostly realized by using of a transformer (which consists of two winding loop inductors that are electromagnetically coupled). A transformer represents a large portion of the work of an RFIC designer and often requires high degree of optimization and numerous iterations, in order to optimize the design. A transformer is generally used for implementing other types of matching network, thanks to its compactness due to IC area size, which is a critical design consideration in all RF, microwave and mm-wave systems.

Transformer realization is often tedious, hand-made, and requires complex electromagnetic tools and high experience to obtain state-of-the-art results. These transformers are not repeatable, and often need to be re-created one by one, each time.

The frequency bandwidth and flatness limitations of an RF system are rarely originated from the transistors themselves and rather, from the passive components themselves. In differential designs, the component that generally limits the frequency bandwidth is the RF transformer, for matching the input and output impedances of 2 different elements.

FIG. 1 (prior art) is a schematic illustration of a classical transformer. Even though this component is compact and allows small design, its small size introduces complex electromagnetic interferences within its own structure. These electromagnetic interferences are hard to model and hard to control, especially as frequency increases. This component requires long, numerous and tedious iterations to reach optimum performances.

A major default of such component is inherent to its structure: its frequency dependent energy transmission. When a single transformer is used, the bandwidth is automatically limited by the single pole offered by the transformer. Therefore, in order to increase the bandwidth, additional poles are often added through the integration of other elements, such as inductors and capacitors, connected in series or in parallel. Two other major advantages result from increasing the order of the transformer-based matching network: the gain flatness control and the design flexibility by having more than a single element to tune.

Gain Bandwidth Enhancement (GBWEN) in RF circuits using improved transformers transimpedance frequency response is highly desired and was already demonstrated in previous works [1-5] to achieve wider band circuits, without compromising its gain and flatness.

FIG. 2 (prior art) shows transimpedance frequency response improvement of higher order transformer (in this example, different fourth order filters), compared to a simple single tuned trans the value of the printed inductor and discontinuities in the transformer can be tuned separately former [5]. As it can be seen from [2-4] that in order to achieve improved bandwidth and flatness, additional lumped elements must be added to the transformer. This added lumped elements improve performance, at the cost of integration space.

While higher order transformer can be generated at V band (50-75 GHz), E band (60-90 GHz) and W band (75-110 GHz) frequencies by using lower coupling factor transformer-based matching network thanks to the transformer inter-winding capacitance, it is hardly possible at lower frequencies, i.e., from X band (8-12 GHz) to Ka band (24-40 GHz), due to required inductance values of the matching network, which enforce higher values of coupling (k).

It is therefore an object of the present invention to provide a compact implementation of a transformer-based matching network, which is faster and flexible to design and requires minimal compromises.

It is another object of the present invention to provide a compact implementation of a transformer-based matching network, which improves the RF system performance and bandwidth, without increasing the IC size area.

It is a further object of the present invention to provide a compact implementation of a transformer-based matching network, which is flexible, and allows matching network modification even at late stages of the design realization.

Other objects and advantages of the invention will become apparent as the description proceeds.

SUMMARY OF THE INVENTION

A method for, reducing the size of an Integrated Circuit (IC) containing at least one printed transformer-based matching network, according to which electromagnetic discontinuities are introduced inside the printed transformer, along the transverse dimension of the IC, to create multiple internal ports within the transformer. Then the order of the transformer-based matching network is increased by adding reactive elements (such as printed inductors or printed capacitors) to one or more of the internal ports, the reactive elements are printed along the transverse dimension of the IC. The order of the transformer-based matching network may be further increased by adding more reactive elements to more internal ports, until obtaining a desired order.

After creating the electromagnetic discontinuities, the main electromagnetic properties of the transformer are maintained.

The printed inductor and discontinuities in the transformer can be tuned separately, at different stages of the IC design.

In one aspect, the reactive elements are added along the Y-axis or Z-axis, without increasing the size of the IC in its critical dimension, along the X-axis. Electromagnetic discontinuities along the transverse dimension (Y-axis) may be introduced in the primary or secondary sides of the printed transformer, or in both sides. Discontinuities in the primary or secondary sides may be filled symmetrically with added inductors or capacitors.

Discontinuities in a transformer with printed conducting strips forming coupled loops may be obtained by varying the spacing between adjacent loops, thereby introducing serial inductance or serial capacitance in the primary or secondary sides.

A printed transformer-based matching network with reduced size, which comprises:
- a) a printed transformer with multiple internal ports in the form of electromagnetic discontinuities, introduced along the transverse dimension of the printed transformer; and
- b) one or more reactive elements, added to of the internal ports to thereby increase the order of the transformer-based matching network, the one or more reactive elements are printed along the transverse dimension of the matching network.

An Integrated Circuit (IC), which comprises:
- a) at least one printed transformer-based matching network with reduced size, which comprises:
- a.1) a printed transformer with multiple internal ports in the form of electromagnetic discontinuities, introduced along the transverse dimension of the printed transformer;
- a.2) one or more reactive elements, added to of the internal ports to thereby increase the order of the transformer-based matching network, the one or more reactive elements are printed along the transverse dimension of the matching network;
- b) a printed component connected to the input port of the matching network; and
- c) a printed component connected to the output port of the matching network.

BRIEF DESCRIPTION OF THE DRAWINGS

The above and other characteristics and advantages of the invention will be better understood through the following illustrative and non-limitative detailed description of preferred embodiments thereof, with reference to the appended drawings, wherein:

FIG. 6A shows an amplifier (implemented as an IC) with two transformer-based higher order matching networks, which are cascaded to other components in the x axis;

FIG. 6B shows an integrated circuit (IC) layout of the first transformer-based higher order matching network 61;

FIG. 6C shows an integrated circuit (IC) layout of the second transformer-based higher order matching network;

FIG. 8a shows the inductance of the equivalent transformer primary loop;

FIG. 8b shows the inductance of the equivalent transformer secondary loop;

DETAILED DESCRIPTION OF PREFERRED EMBODIMENTS

The present invention proposes a compact flexible design and implementation of a transformer-based matching network, which improves the RF system performance and bandwidth, without increasing the IC size area. The proposed implementation uses electromagnetic discontinuity inside a transformer structure, which introduces multiple internal ports within the transformer that serve as an internal interface to exterior means (added printed reactive components), while maintaining its main electromagnetic properties (i.e., the electromagnetic mechanism behavior) even after creating electromagnetic discontinuities. These internal ports are used for realizing higher order matching network that improve the circuit performance (i.e., flatness and frequency bandwidth), by adding reactive elements, such as an inductor to one or more internal ports. These internal ports are used as a part of a higher matching network that result in significant matching network size reduction and therefore, global IC size reduction, and without varying the main circuit dimension. The invention allows faster realization of the matching network with more flexibility and improved performance.

In this example, moving the inductor from the transformer's input to the first internal ports did not affect the main electromagnetic mechanism behavior. In this specific case, this means that the electromagnetic discontinuity is non-interfering as well as non-disruptive and that the added inductor had little effect on the behavior of the electromagnetic transformer. Thanks to this property, the printed inductor and the discontinuities in the transformer can be tuned separately at different stages of the IC design and realization, since they are not correlated.

Figure 1:
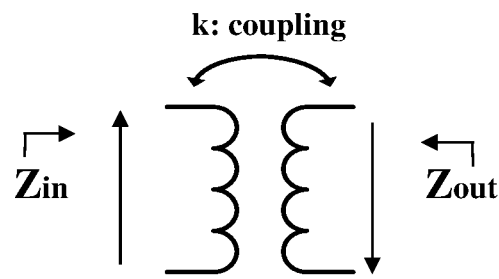
FIG. 1 (prior art) is a schematic illustration of a classical transformer.
Figure 2:
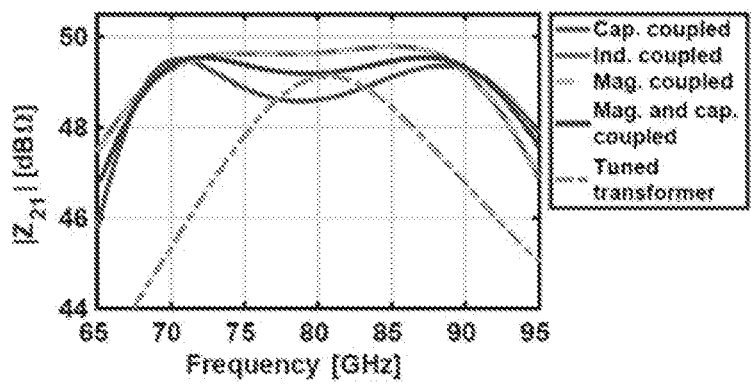
FIG. 2 (prior art) shows an example of the performance of a simple tuned transformer versus a 4th order based-transformer matching network.
Figure 3:
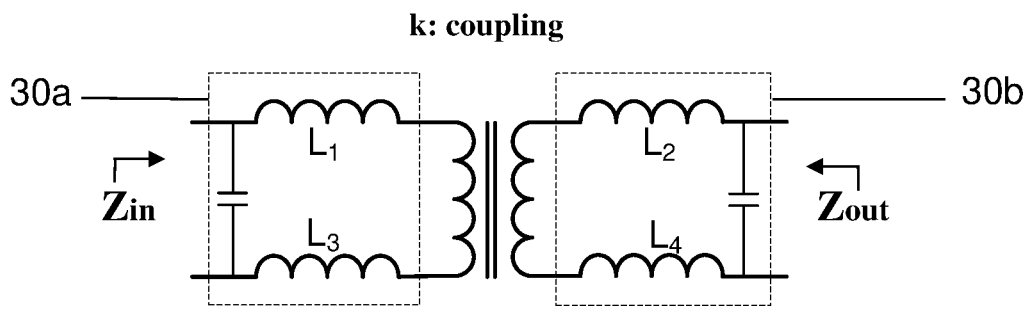
FIG. 3 (prior art) illustrates the realization of higher order transformer-based matching networks 30a and 30b, using serial inductors L1-L4 or parallel capacitors C1-C2.

FIG. 3 (prior art) illustrates the realization of higher order transformer-based matching networks 30a and 30b, using serial inductors L1-L4 or parallel capacitors C1-C2. These components (L1-L4 and C1-C2) are used in order to allow wideband design and improve gain flatness and return loss. However, a major drawback of such a prior-art technique is the space required by the additional inductors, which increases the matching network dimension and therefore, the IC size area. Such matching networks, even though providing better results, are often dismissed by their size constraints, which are critical in large scale integration circuits and system.

The implementation proposed by the present invention allows obtaining higher order transformer-based matching network by creating multiple internal ports through electromagnetic discontinuity in the transformer, while still maintaining its main electromagnetic mechanism. These internal ports can be then used to add reactive elements (i.e., inductors, capacitors) in Y-Z axis and obtain improved higher order matching network design, without increasing the size that is typically determined by the critical dimension (the X-axis). Adding more reactive elements to more internal ports increases the order of the transformer-based matching network, until obtaining a desired order.

Figure 4:
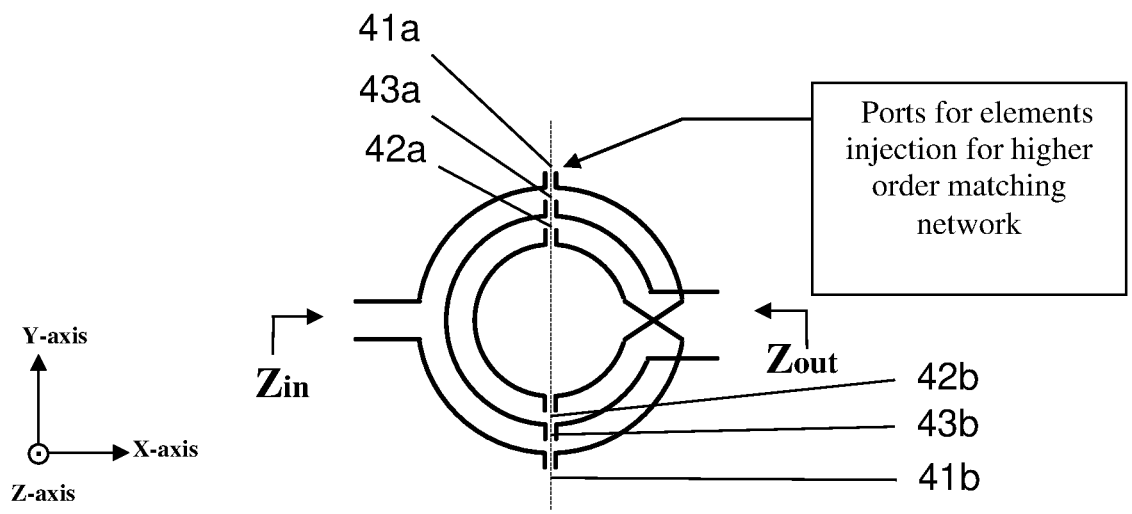
FIG. 4 shows the modified transformer layout 40 and electromagnetic discontinuities in the Y-axis plane, according to an embodiment of the invention.

FIG. 4 shows the modified transformer layout 40 and electromagnetic discontinuities in the transverse dimension (in this example, the Y-axis plane), according to an embodiment of the invention. In this example, the first group of internal ports introduced by the electromagnetic discontinuities are used for allowing moving an inductor (e.g., $L_1$ of FIG. 3) from the input of the transformer to the first group of internal ports 41a and 41b, while introducing minor (to negligible) differences. The internal ports 41a 41b, 42a, 42b in the primary side and 43a, 43b in the secondary side allow size reduction of the resulting higher order matching network and improving circuit performances with a flexible design.

In most cases, the IC critical dimension is the X-axis (the longitudinal dimension, along which the path from input to output is typically deployed) of the component, while the Y-axis (the transverse dimension) is less critical. In large scale integration, it becomes very problematic to add, increase or even decrease at some point the component size, since each component acts geographically as an accurate piece of a larger puzzle. The possibility of adding elements in the non-critical in this example, the Y-axis transformer discontinuity plane at later stage of the design for no space modifications, introduces another degree of design flexibility and overall better methodology.

Figures 5A, 5B:
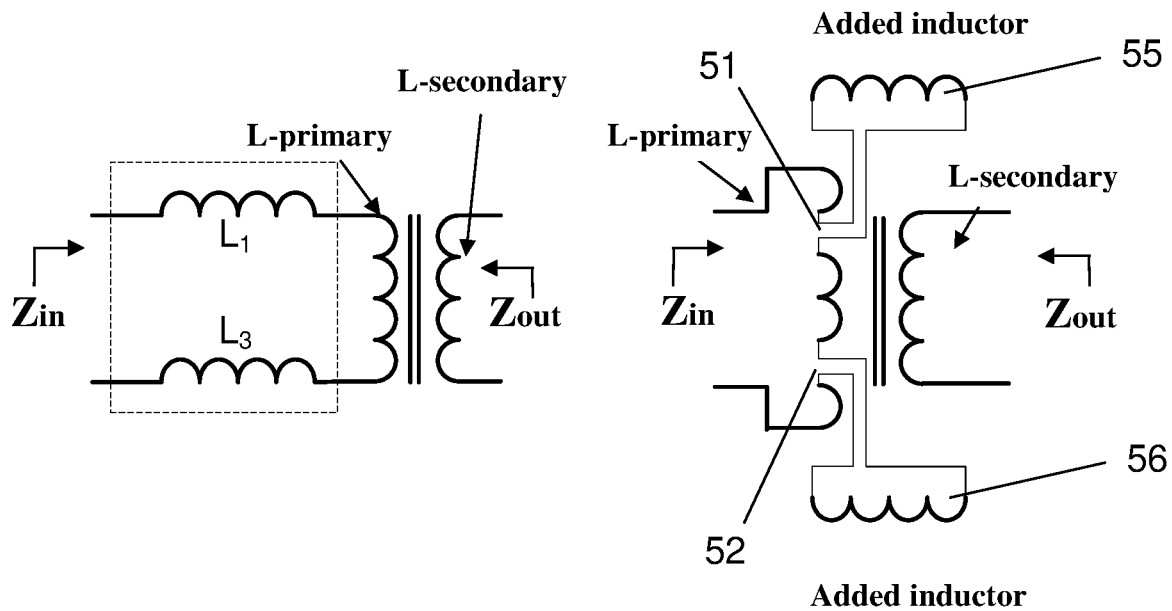
FIG. 5A (prior art) shows a lumped electronic model of a conventional transformer-based matching network implementation.
FIG. 5B shows a lumped electronic model of a chosen higher order matching network, according to an embodiment of the invention.

FIG. 5A (prior art) shows a lumped electronic model of a conventional transformer-based matching network implementation. In this example, the matching network 50 at the primary side includes two added series inductors $L_1$ and $L_3$.

FIG. 5B shows a lumped electronic model of a chosen higher order matching network, according to an embodiment of the invention. In this embodiment, discontinuities 51 and 52 in the primary (which form two internal ports 53 and 54) side are filled with two added inductors 55 and 56, respectively. Discontinuities in the primary or secondary sides may be filled symmetrically or asymmetrically, with added inductors or capacitors.

FIGS. 6A-6C illustrates examples of transformer-based higher order matching network using internal ports created by electromagnetic transformer discontinuities, in CMOS 180 nm at K-band frequencies.

FIG. 6A shows an amplifier 60 (implemented as an IC) with two transformer-based higher order matching networks 61 and 62, which are cascaded to other components in the x axis.

FIG. 6B shows an Integrated Circuit (IC) layout of the first transformer-based higher order matching network 61. The transformer 64 is implemented by printed conducting strips forming coupled loops (inductors), where the spacing between adjacent loops determines the desired mutual inductance. It can be seen that the two printed discontinuities 41a and 41b contain two printed serial inductors 63a and 63b (implemented by loops of printed conducting strips), which are inserted into discontinuities 41a and 41b, respectively. Each serial inductor 63a and 63b is printed in the form of a loop, such that the loop length implements the desired serial inductance and occupies area along the Y-axis of the IC (rather than along the critical X-axis). In transformers with printed conducting strips that form coupled loops, discontinuities may be obtained by varying the spacing between adjacent loops, so as to introduce serial inductance or serial capacitance in the primary or secondary sides of the transformer.

FIG. 6C shows an integrated circuit (IC) layout of the second transformer-based higher order matching network 61. Here also, the transformer 64 is implemented by printed conducting strips forming coupled loops (inductors), where the spacing between adjacent loops determines the desired mutual inductance. In this case also, the two printed discontinuities contain two printed serial inductors 65a and 65b (implemented by loops of printed conducting strips), each with two coupled loops that increase the inductance value. Here again, the loop length implements the desired serial inductance and occupies area along the Y-axis of the IC (rather than along the critical X-axis).

Figure 7B:
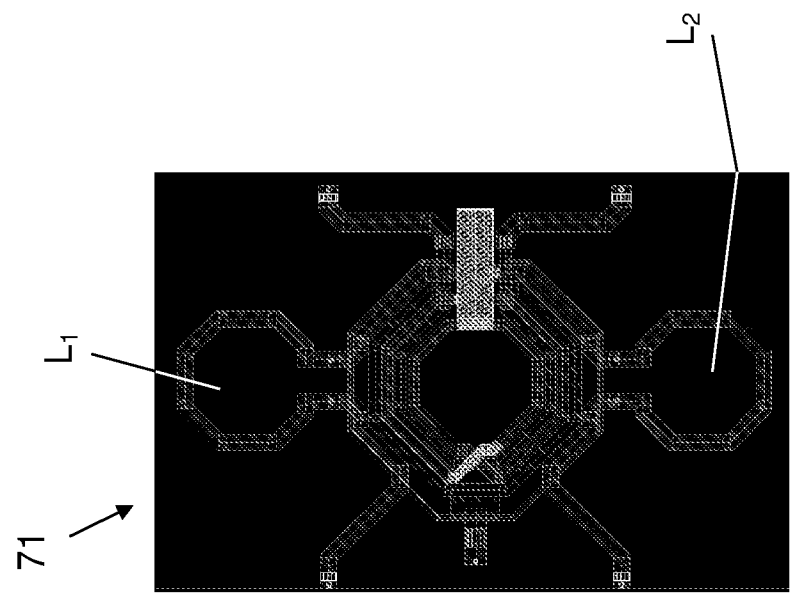
FIG. 7b shows the layout of an IC with the proposed implementation of the higher order transformer-based matching network (realized in CMOS 180 nm technology) using two printed discontinuities.
Figure 7A:
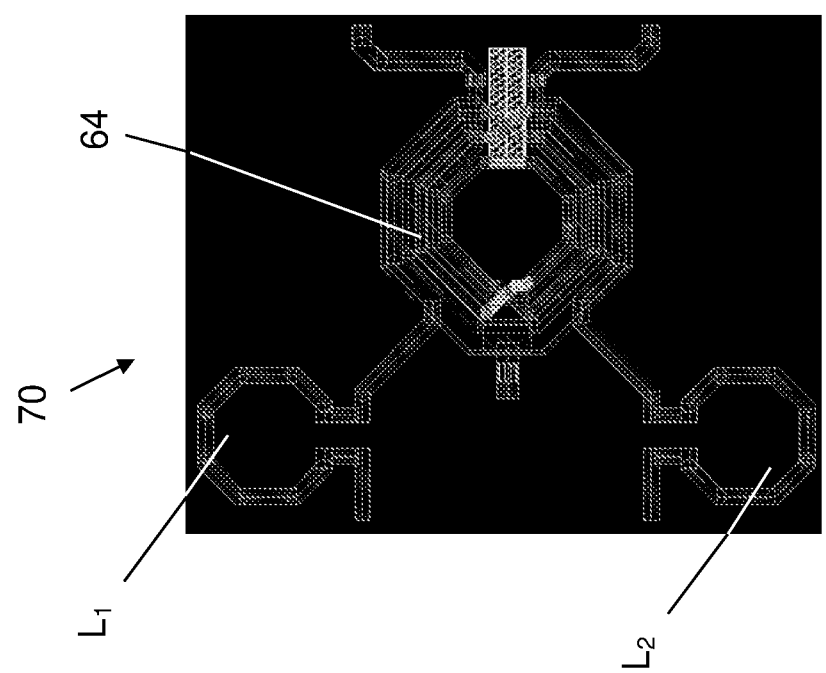
FIG. 7a shows the layout of an IC with a conventional implementation of the higher order transformer-based matching network, realized in CMOS 180 nm technology.

FIG. 7a shows the layout of an IC 70 with a conventional implementation of the higher order transformer-based matching network, realized in CMOS 180 nm technology. In this implementation, the serial inductors $L_1$ and $L_2$ are printed before the printed transformer 64 and therefore, occupy precious area in the X-axis.

FIG. 7b shows the layout of an IC 71 with the proposed implementation of the higher order transformer-based matching network (realized in CMOS 180 nm technology) using two printed discontinuities, such that the two printed serial inductors $L_1$ and $L_2$ are located such that they occupy area along the Y-axis of the IC (rather than along the critical X-axis). This allows saving about 30% of the IC area.

Figure 8C:
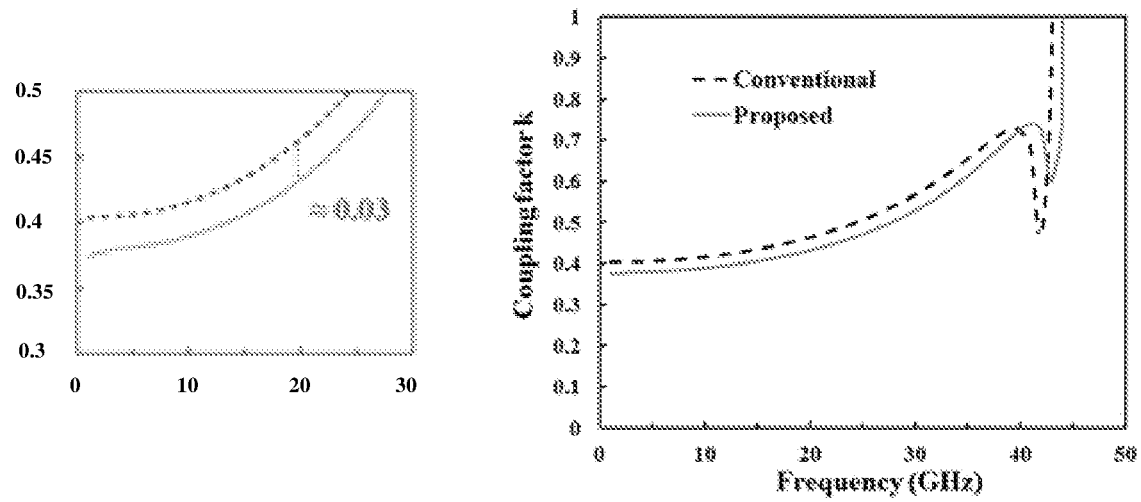
FIG. 8c shows the coupling factor of the equivalent transformer.

FIGS. 8a-8c show the electromagnetic properties of both structures, where FIG. 8a shows the inductance of the equivalent transformer primary loop, FIG. 8b shows the inductance of the equivalent transformer secondary loop and FIG. 8c shows the coupling factor of the equivalent transformer. Inductances and coupling of the equivalent transformer loops with the conventional and proposed technique are compared using the input and output Z-parameters. As seen, extremely minor differences are observed between the conventional approach and proposed technique (around 2%). Therefore, for almost no electrical performances differences, a similar matching network can be realized with considerable size reduction–30% size reduction in this case.

Figure 9A:
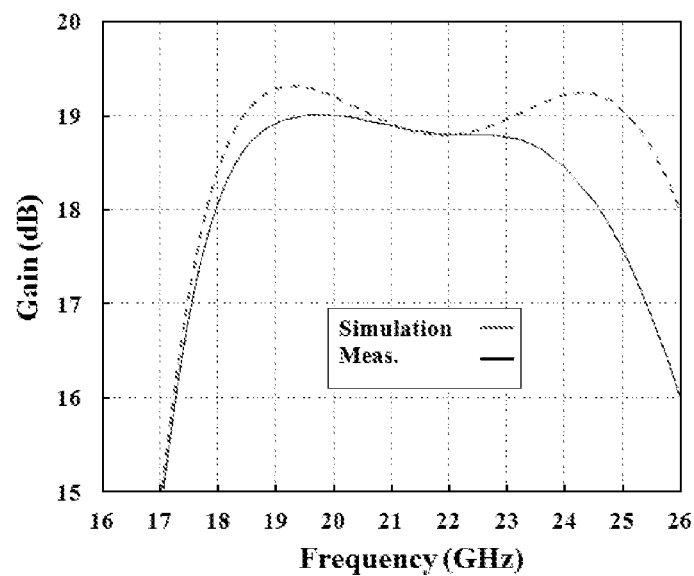
FIGS. 9a and 9b show the measurement gain and return loss results, respectively, of a 2-stage RF K-band amplifier using the proposed technique in 180 nm CMOS.
Figure 9B:
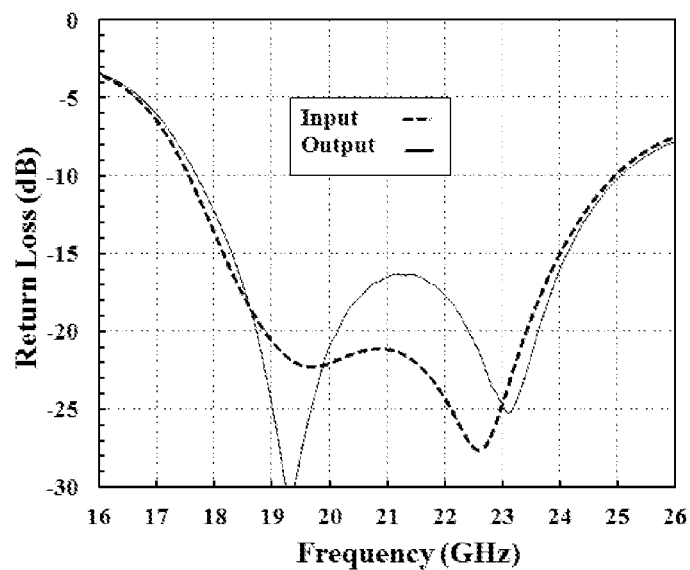

FIGS. 9a and 9b show the measurement gain and return loss results, respectively, of a 2-stage RF K-band amplifier 60 using the proposed technique in 180 nm CMOS. As seen, state-of-the-art flatness over large bandwidth is achieved for no additional size thanks to the use of higher order matching network, according to an embodiment of the invention. In this example, if a conventional matching network would have been used, the circuit size would have been typically around 15-20% larger in total.

The above examples and description have of course been provided only for the purpose of illustrations, and are not intended to limit the invention in any way. As will be appreciated by the skilled person, the invention can be carried out in a great variety of ways, employing more than one technique from those described above, including the internet, a cellular network or any other wireless data network, all without exceeding the scope of the invention.

REFERENCES

[1] C.-H. Li, C.-N. Kuo, and M.-C. Kuo, "A 1.2-V 5.2-mW 20-30-GHz wideband receiver front-end in 0.18-μm CMOS," IEEE Trans. Microw. Theory Techn., vol. 60, no. 11, pp. 2709-2722, November 2011.

[2] M. Bassi, J. Zhao, A. Bevilacqua, A. Ghilioni, A. Mazzanti, and F. Svelto, "A 40-67 GHz power amplifier with 13 dBm PSAT and 16% PAE in 28 nm CMOS LP," IEEE J. Solid-State Circuits, vol. 50, no. 7, pp. 1618-1628, July 2015.

[3] J. Zhao, M. Bassi, A. Mazzanti, and F. Svelto, "A 15 GHz-bandwidth 20 dBm PSAT power amplifier with 22% PAE in 65 nm CMOS," in Proc. IEEE Custom Integr. Circuits Conf. (CICC), September 2015, pp. 1-4.

[4] V. Bhagavatula, T. Zhang, A. R. Suvarna, and J. C. Rudell, "An ultrawideband IF millimeter-wave receiver with a 20 GHz channel bandwidth using gain-equalized transformers," IEEE J. Solid-State Circuits, vol. 51, no. 2, pp. 323-331, February 2016.

[5] Marco Vigilante and Patrick Reynaert, "On the Design of Wideband Transformer-Based Fourth Order Matching Networks for E-Band Receivers in 28-nm CMOS", IEEE J. Solid-State Circuits, vol. 52, no. 8, August 2017.

The invention claimed is:

1. A method for reducing the size of an Integrated Circuit (IC) containing at least one printed transformer-based matching network, comprising:
   a) introducing electromagnetic discontinuities inside said printed transformer, along a transverse dimension of said IC, to create multiple internal ports within said transformer; and
   b) increasing an order of said transformer-based matching network to a desired order by adding reactive elements to one or more of said internal ports, said reactive elements are printed along the transverse dimension of said IC,
   c) wherein the transverse dimension comprises at least one of a Y-axis and a Z-axis,
   wherein a path from input to output of said IC is deployed along an X-axis, wherein the X-axis is perpendicular to the Y-axis, and wherein a plane including the X-axis and the Y-axis is perpendicular to the Z-axis.

2. A method according to claim 1, wherein the order of said transformer-based matching network is further increased by adding more reactive elements to more internal ports, until obtaining the desired order.

3. A method according to claim 1, wherein the reactive elements are printed inductors.

4. A method according to claim 1, wherein the reactive elements are printed capacitors.

5. A method according to claim 1, wherein electromagnetic properties of the transformer are maintained after creating the electromagnetic discontinuities.

6. A method according to claim 2, wherein the value of the printed inductor and discontinuities in the transformer can be tuned separately, at different stages of the IC design.

7. A method according to claim 1, wherein reactive elements are added along the Y-axis or the Z-axis, without increasing the size of the IC in its critical dimension, along the X-axis.

8. A method according to claim 1, wherein electromagnetic discontinuities along the transverse dimension (Y-axis), are introduced in the primary or secondary sides of the printed transformer, or in both sides.

9. A method according to claim 1, wherein discontinuities in the primary or secondary sides are filled symmetrically with added inductors or capacitors.

10. A method according to claim 1, wherein discontinuities in a transformer with printed conducting strips forming coupled loops are obtained by varying the spacing between adjacent loops.

11. A method according to claim 10, wherein varying the spacing between adjacent loops introduces serial inductance or serial capacitance in the primary or secondary sides.

12. A printed transformer-based matching network with reduced size, comprising:
   a) a printed transformer with multiple internal ports in the form of electromagnetic discontinuities, introduced along a transverse dimension of said printed transformer; and
   b) one or more reactive elements, added to one or more of said internal ports to thereby increase an order of said transformer-based matching network to a desired order, said one or more reactive elements are printed along the transverse dimension of said matching network,
   c) wherein the transverse dimension comprises at least one of a Y-axis and a Z-axis,
   wherein a path from input to output of said IC is deployed along an X-axis, wherein the X-axis is perpendicular to the Y-axis, and wherein a plane including the X-axis and the Y-axis is perpendicular to the Z-axis.

13. A matching network according to claim 12, further comprising additional reactive elements connected to additional internal ports, until obtaining the desired order.

14. A matching network according to claim 12, in which the reactive elements are printed inductors and/or printed capacitors.

15. A matching network according to claim 12, in which reactive elements are added along the Y-axis or the Z-axis, without increasing the size of the IC in its critical dimension, along the X-axis.

16. A matching network according to claim 12, in which electromagnetic discontinuities along the transverse dimension (Y-axis), are introduced in the primary or secondary sides of the printed transformer, or in both sides.

17. A matching network according to claim 12, in which wherein discontinuities in the primary or secondary sides are filled symmetrically with added inductors or capacitors.

18. A matching network according to claim 12, in which discontinuities in a transformer with printed conducting strips forming coupled loops are obtained by varying the spacing between adjacent loops.

19. A matching network according to claim 12, in which the spacing between adjacent loops is varied, to introduce serial inductance or serial capacitance in the primary or secondary sides.

20. An Integrated Circuit (IC) comprising:
   a) at least one printed transformer-based matching network with reduced size, which comprises:
      a.1) a printed transformer with multiple internal ports in the form of electromagnetic discontinuities, introduced along a transverse dimension of said printed transformer;
      a.2) one or more reactive elements, added to one or more of said internal ports to thereby increase an order of said transformer-based matching network to a desired order, said one or more reactive elements are printed along the transverse dimension of said matching network;

b) a printed component connected to the input port of said matching network; and
c) a printed component connected to the output port of said matching network,
d) wherein the transverse dimension comprises at least one of a Y-axis and a Z-axis, wherein a path from input to output of said IC is deployed along an X-axis, wherein the X-axis is perpendicular to the Y-axis, and wherein a plane including the X-axis and the Y-axis is perpendicular to the Z-axis.

* * * * *